(12) United States Patent
Sakai

(10) Patent No.: US 9,150,017 B2
(45) Date of Patent: Oct. 6, 2015

(54) LIQUID EJECTING HEAD, LIQUID EJECTING APPARATUS AND PIEZOELECTRIC ELEMENT

(71) Applicant: Seiko Epson Corporation, Tokyo (JP)

(72) Inventor: Tomohiro Sakai, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/847,120

(22) Filed: Mar. 19, 2013

(65) Prior Publication Data

US 2013/0250010 A1   Sep. 26, 2013

(30) Foreign Application Priority Data

Mar. 22, 2012   (JP) ................... 2012-066423

(51) Int. Cl.
  *B41J 2/045*   (2006.01)
  *B41J 2/14*   (2006.01)
  *B41J 2/16*   (2006.01)

(52) U.S. Cl.
  CPC ......... *B41J 2/14201* (2013.01); *B41J 2/14233* (2013.01); *B41J 2/161* (2013.01); *B41J 2/1623* (2013.01); *B41J 2/1629* (2013.01); *B41J 2/1632* (2013.01); *B41J 2/1642* (2013.01); *B41J 2/1645* (2013.01); *B41J 2/1646* (2013.01); *B41J 2002/14241* (2013.01); *B41J 2002/14419* (2013.01); *B41J 2202/03* (2013.01)

(58) Field of Classification Search
  None
  See application file for complete search history.

(56) References Cited

U.S. PATENT DOCUMENTS

2007/0241642 A1   10/2007   Miyazawa et al.
2011/0164098 A1*   7/2011   Kobayashi et al. ............. 347/71

FOREIGN PATENT DOCUMENTS

JP   2001-223404 A   8/2001
JP   2007-287745 A   11/2007

* cited by examiner

*Primary Examiner* — Erica Lin
(74) *Attorney, Agent, or Firm* — Harness, Dickey & Pierce, P.L.C.

(57) ABSTRACT

A liquid ejecting head which discharges a liquid from a nozzle opening including a piezoelectric body layer and a piezoelectric element possessing an electrode which is arranged on the piezoelectric body layer, wherein the piezoelectric body layer consists of a complex oxide having a perovskite structure, and when 2θ is fixed within the range of 21.9° to 22.7° to scan in the direction of the χ-axis, the piezoelectric body layer has a peak in the range of 4.75° to 28.3° and when 2θ is fixed within the range of 31.1° to 32.6° to scan in the direction of the χ-axis, the piezoelectric body layer has a peak in the range of 24.8° to 40.75°.

13 Claims, 18 Drawing Sheets

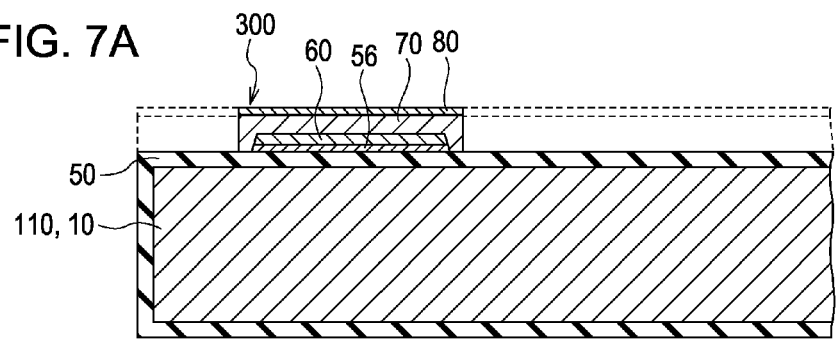
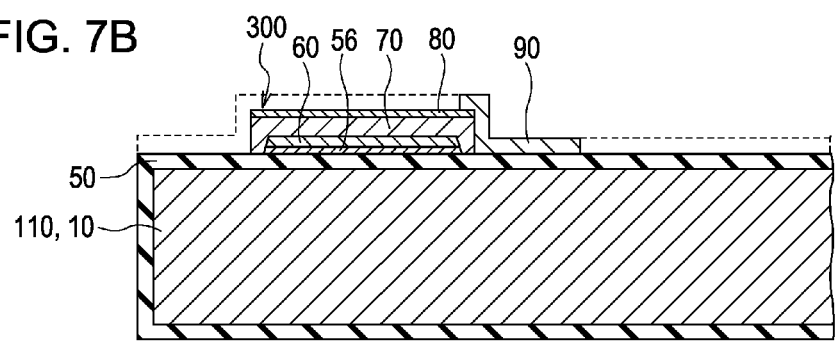
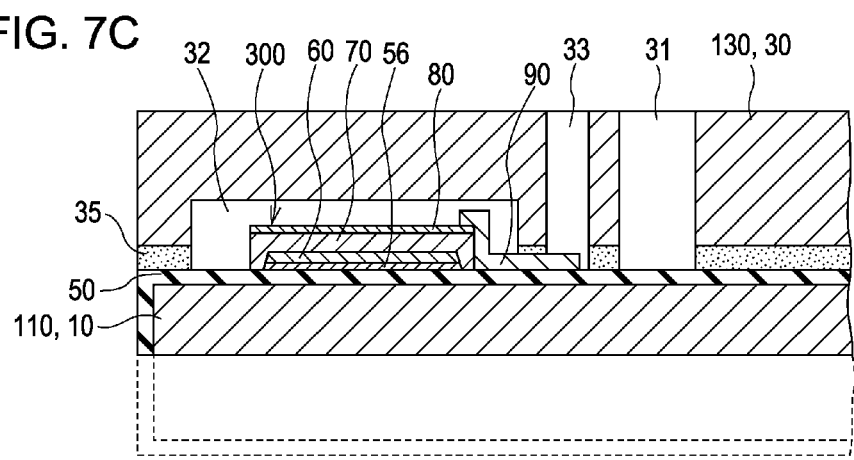

2θ = 22.5°

2θ = 32.0°

2θ = 22.5°

2θ = 32.0°

2θ = 22.5°

2θ = 32.0°

2θ = 22.5°

2θ = 32.0°

$2\theta = 22.5°$ $2\theta = 32.0°$

2θ=22.5°

2θ=32.0°

2θ = 21.9°

2θ = 31.1°

$2\theta = 22.7°$ $2\theta = 32.6°$

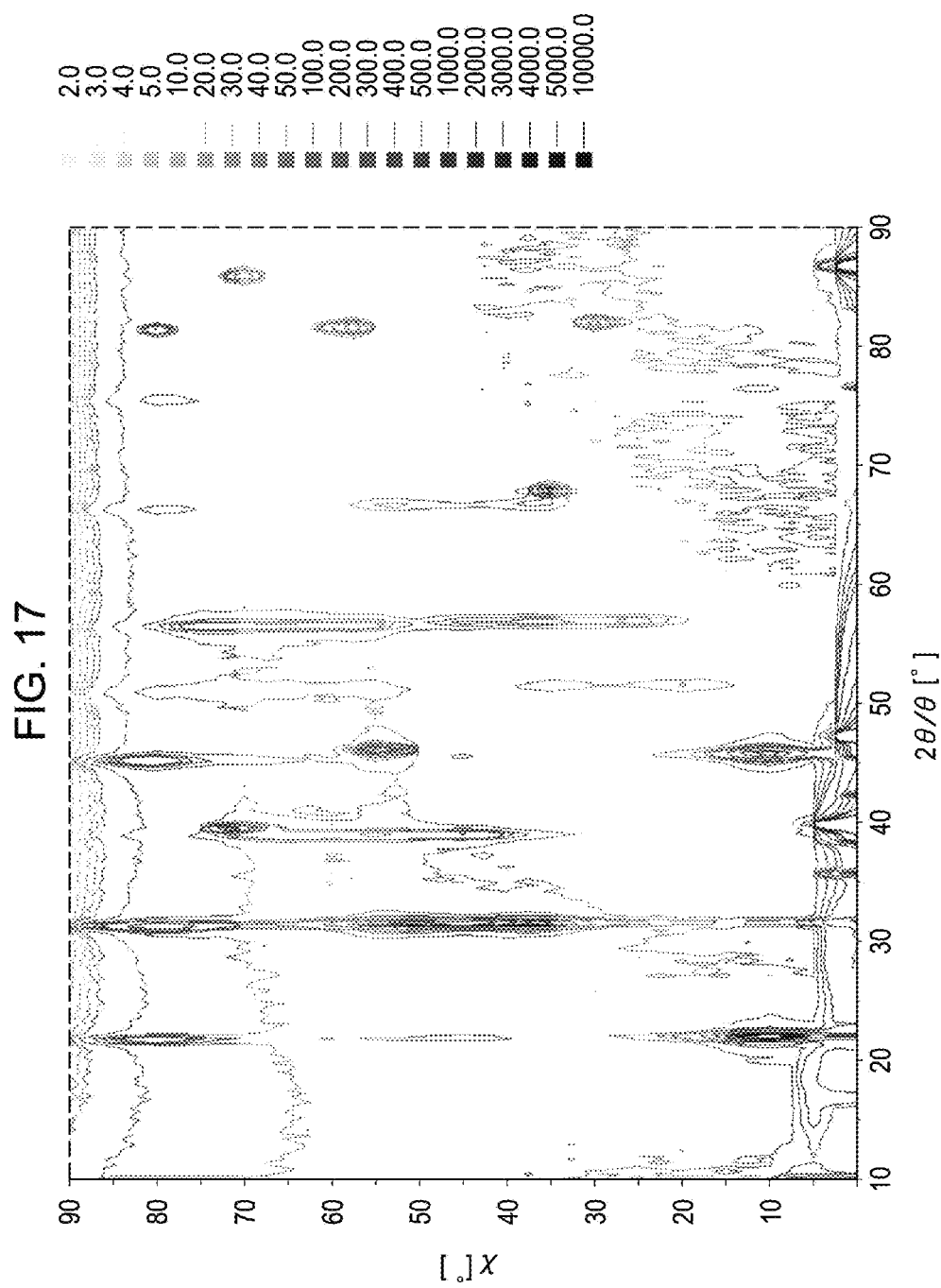

LIQUID EJECTING HEAD, LIQUID EJECTING APPARATUS AND PIEZOELECTRIC ELEMENT

The entire disclosure of Japanese Patent Application No. 2012-066423, filed Mar. 22, 2012 is incorporated by reference herein.

BACKGROUND

1. Technical Field

The present invention relates to a liquid ejecting head which possesses a piezoelectric body layer consisting of a piezoelectric material and a piezoelectric element having an electrode and which discharges droplets from a nozzle opening, a liquid ejecting apparatus and a piezoelectric element.

2. Related Art

As a piezoelectric element which is used in a liquid ejecting head, there is a piezoelectric element which is configured by sandwiching a piezoelectric material which is present with an electromechanical conversion function, for example, a piezoelectric body layer consisting of a crystallized dielectric material between two electrodes. Such a piezoelectric element is mounted on the liquid ejecting head, for example, as an actuator apparatus in a flexural vibration mode. Here, as a representative example of the liquid ejecting head, for example, there is an ink jet recording head in which a part of a pressure generating chamber communicates with a nozzle opening which discharges ink drops, it is configured by a trembler and by transforming the trembler by the piezoelectric element, pressure is applied to ink in the pressure generating chamber to discharge from the nozzle opening as an ink drop.

There is a demand for high piezoelectric characteristics in a piezoelectric material used as a piezoelectric body layer configuring such a piezoelectric element and as a representative example of the piezoelectric material, lead zirconate titanate (PZT) is included (refer to JP-A-2001-223404). However, from the point of view of an environmental problem, there is a demand for a piezoelectric material which is reduced the content of a non-lead or a lead. As a piezoelectric material which does not include lead, for example, there is a $BiFeO_3$-based piezoelectric material including Bi and Fe (for example, refer to JP-A-2007-287745).

However, there is a problem that a crack is likely to occur on a piezoelectric body layer consisting of a complex oxide which is reduced the content of such a non-lead or a lead.

Here, such a problem is similarly present not only in an ink jet recording head, naturally, but also in other liquid ejecting heads which discharge droplets other than an ink, and further, is similarly present in an piezoelectric element to be used other than a liquid ejecting head.

SUMMARY

An advantage of some aspects of the invention is to provide a liquid ejecting head without the occurrence of cracks, a liquid ejecting apparatus and a piezoelectric element.

According to an aspect of the invention, there is provided a liquid ejecting head which discharges a liquid from a nozzle opening, including a piezoelectric body layer and a piezoelectric element possessing an electrode which is arranged on the piezoelectric body layer, wherein the piezoelectric body layer consists of a complex oxide having a perovskite structure, and when 2θ is fixed within the range of 21.9° to 22.7° to scan in the direction of the χ-axis, the piezoelectric body layer has a peak in the range of 4.75° to 28.3° and when 2θ is fixed within the range of 31.1° to 32.6° to scan in the direction of the χ-axis, the piezoelectric body layer has a peak in the range of 24.8° to 40.75°.

In the above aspect, since the piezoelectric body layer is strongly oriented on the surface of the predetermined range, it is possible to realize a head having the piezoelectric body layer without the occurrence of cracks.

In addition, according to another aspect of the invention, there is provided a liquid ejecting apparatus possessing the liquid ejecting head in the above-described aspect. According to this, it is possible to realize the liquid ejecting apparatus having the liquid ejecting head without the occurrence of cracks.

Further, according to still another aspect of the invention, there is provided a piezoelectric element including a piezoelectric body layer and an electrode which is arranged on the piezoelectric body layer, wherein the piezoelectric body layer consists of a complex oxide having a perovskite structure, and when 2θ is fixed within the range of 21.9° to 22.7° to scan in the direction of the χ-axis, the piezoelectric body layer has a peak in the range of 4.75° to 28.3° and when 2θ is fixed within the range of 31.1° to 32.6° to scan in the direction of the χ-axis, the piezoelectric body layer has a peak in the range of 24.8° to 40.75°.

In the above aspect, by strongly orienting the piezoelectric body layer on the surface of the predetermined range, the piezoelectric element is formed without the occurrence of cracks.

BRIEF DESCRIPTION OF THE DRAWINGS

The invention will be described with reference to the accompanying drawings, wherein like numbers reference like elements.

FIGS. 7A to 7C are sectional views showing a manufacturing process of a recording head according to a first embodiment of the invention.

FIG. 17 is a view of a broad reciprocal lattice mapping.

DESCRIPTION OF EXEMPLARY EMBODIMENTS

First Embodiment

Figure 1:
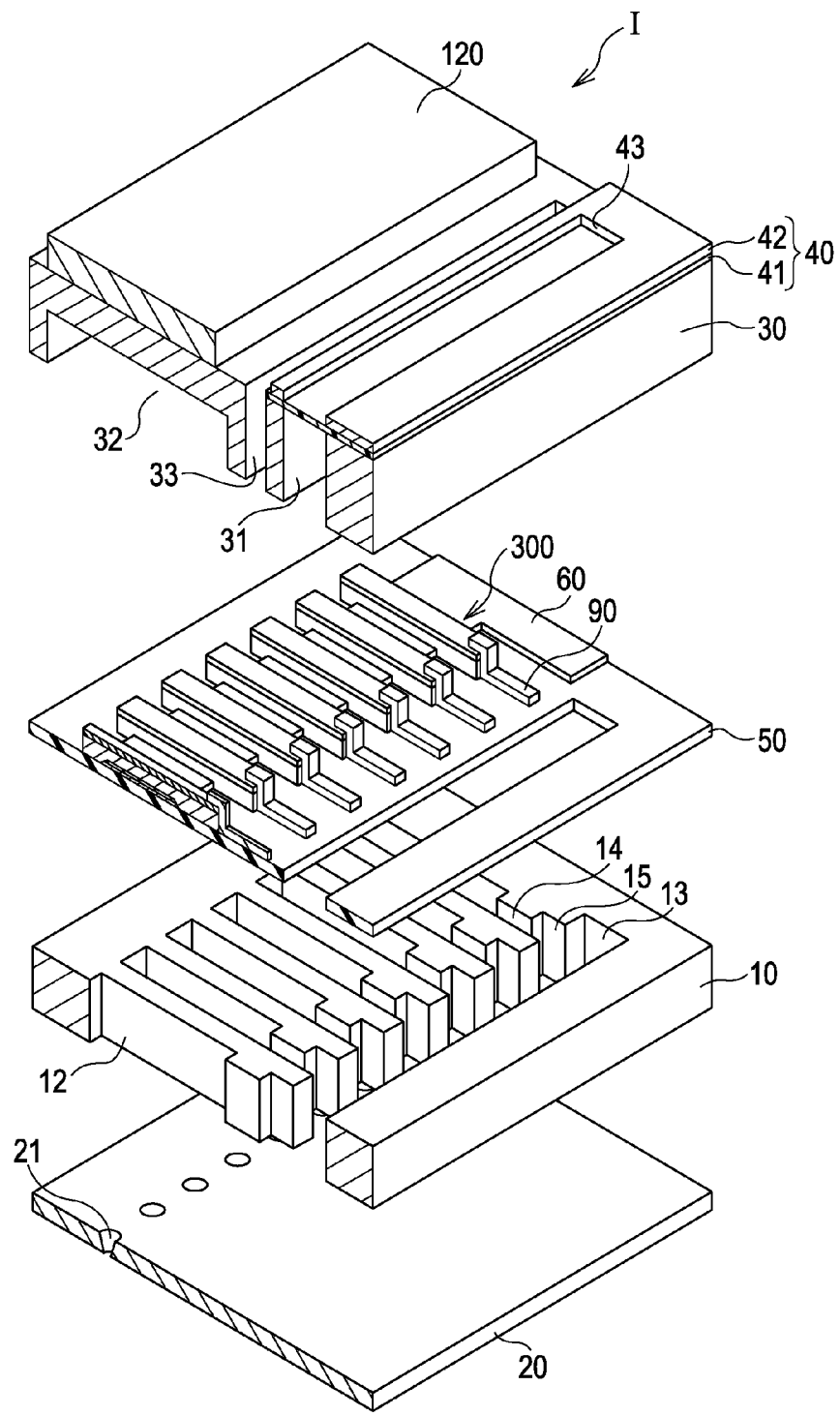
FIG. 1 is an exploded perspective view showing a schematic configuration of a recording head according to a first embodiment of the invention.
Figure 2:
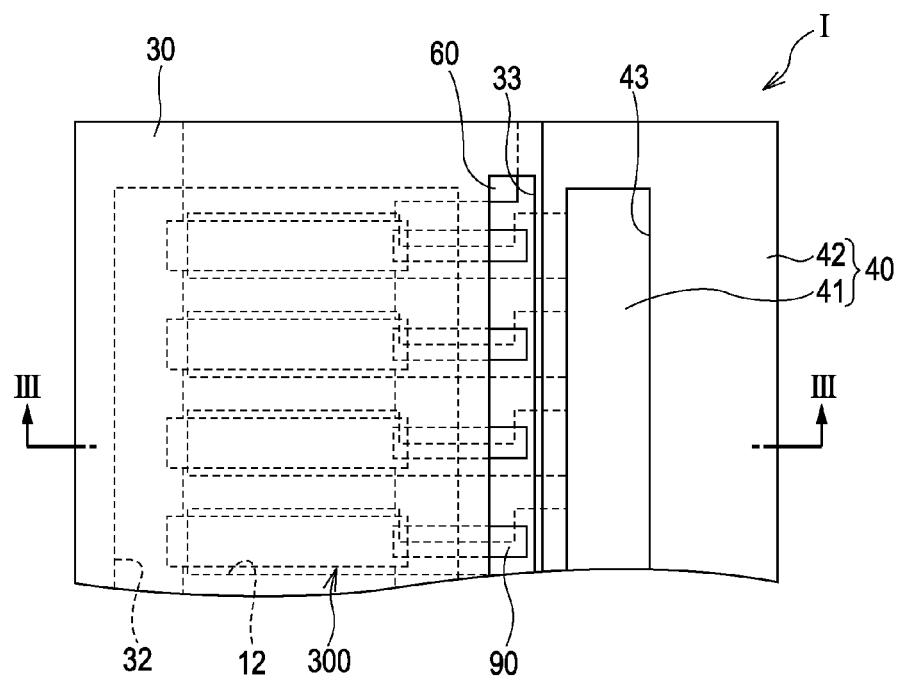
FIG. 2 is a plan view of a recording head according to a first embodiment of the invention.
Figure 3:
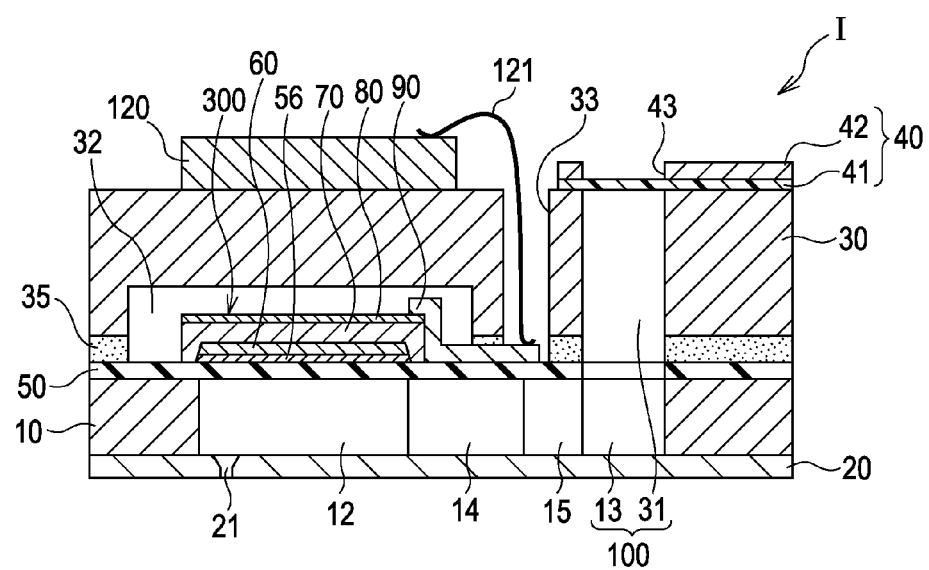
FIG. 3 is a sectional view of a recording head according to a first embodiment of the invention.

FIG. 1 is an exploded perspective view showing a schematic configuration of an ink jet recording head which is an example of a liquid ejecting head according to a first embodiment of the invention, FIG. 2 is plan view of FIG. 1 and FIG. 3 is a sectional view of the line III-III' of FIG. 2. A channel formation substrate 10 in the embodiment consists of a silicon single crystal substrate as shown in FIG. 1 to FIG. 3 and an elastic film 50 consisting of silicon dioxide is formed on one surface.

On the channel formation substrate 10, a plurality of the pressure generating chambers 12 are arranged in parallel in the width direction thereof. In addition, a communicating unit 13 is formed in the exterior area in the longitudinal direction of the pressure generating chamber 12 of the channel formation substrate 10 and the communicating unit 13 and each pressure generating chamber 12 are communicated through an ink supply route 14 which is arranged in each pressure generating chamber 12 and a communicating route 15. The communicating unit 13 configures a part of a manifold which becomes a common ink chamber of each pressure generating chamber 12 by communicating with a manifold unit 31 of a protective substrate to be described later. The ink supply route 14 is formed with the narrower width than the pressure generating chamber 12 and retains the constant channel resistance of an ink flowing into the pressure generating chamber 12 from the communicating unit 13. Here, in the embodiment, by narrowing down the width of the channel from one side, the ink supply route 14 was formed, however, by narrowing down the width of the channel from both sides, the ink supply route may be formed. In addition, instead of narrowing down the width of the channel, by narrowing down from the thickness direction, the ink supply route may be formed. In the embodiment, on the channel formation substrate 10, a liquid channel consisting of the pressure generating chamber 12, the communicating unit 13, the ink supply route 14 and the communicating route 15 is arranged.

In addition, a nozzle plate 20 in which a nozzle opening 21 communicating in the vicinity of the edge of the opposite side with respect to the ink supply route 14 in each pressure generating chamber 12 is pierced, is stuck using an adhesive agent, a thermal welding film or the like on the opening surface side of the channel formation substrate 10. Here, the nozzle plate 20, for example, consists of a glass ceramic, a silicon single crystal substrate, a stainless steel or the like.

On the other hand, the elastic film 50 is formed on the opposite side with respect to the opening surface of such a channel formation substrate 10 as described above, an adhesion layer 56 which consists of, for example, titanium oxide of the thickness of approximately 30 to 50 nm or the like and is for improving the adhesion with the foundation of a first electrode 60 of the elastic film 50 or the like is arranged on the elastic film 50. Here, an insulator film consisting of zirconium oxide or the like may be arranged on the elastic film 50 as necessary.

Further, a piezoelectric element 300 as a pressure generating unit which makes the pressure generating chamber 12 produce the pressure change, is configured by laminating the first electrode 60, a piezoelectric body layer 70 which is a thin film of the thickness of 620 nm to 1,520 nm and a second electrode 80 on the adhesion layer 56. Here, the piezoelectric element 300 refers to the part including the first electrode 60, the piezoelectric body layer 70 and the second electrode 80. Generally, one of any electrodes of the piezoelectric element 300 is set as a common electrode and the other electrode and the piezoelectric body layer 70 are configured by patterning at each pressure generating chamber 12. In the embodiment, the first electrode 60 is set as the common electrode of the piezoelectric element 300, the second electrode 80 is set as the individual electrode of the piezoelectric element 300, however, even if these are set the other way around according to their convenience of a drive circuit and wiring, there is no problem. In addition, here, the piezoelectric element 300 and a trembler which causes displacement by a drive of the piezoelectric element 300 are combined together to be termed as an actuator apparatus. Here, in the example described above, the elastic film 50, the adhesion layer 56, the first electrode 60 and the insulator film which is arranged as necessary act as the trembler, however, naturally, there is no limitation to these and, for example, the elastic film 50 or the adhesion layer 56 may not be arranged. In addition, the piezoelectric element 300 itself may substantially hold the action of the trembler.

Further, in the embodiment, the piezoelectric material configuring the piezoelectric body layer 70 is a complex oxide having a perovskite structure. Particularly, in order to reduce the environmental burden, a complex oxide, which includes bismuth (Bi), iron (Fe), barium (Ba) and titanium (Ti) due to reducing the content of non-lead or lead and has a perovskite structure, is preferable. In this case, the perovskite structure, in other words, 12 oxygens are coordinated at A site of an $ABO_3$ type structure or 6 oxygens are coordinated at B site to make an octahedron. Bi and Ba are located at A site and Fe and Ti are located at B site.

The complex oxide which includes such Bi, Fe, Ba, and Ti and has a perovskite structure is represented as a complex oxide having a perovskite structure of a mixed crystal of bismuth ferrate and barium titanate or a solid solution in which bismuth ferrate and barium titanate are uniformly dissolved. Here, bismuth ferrate and barium titanate are not detected alone in an X-ray diffraction pattern.

Here, bismuth ferrate and barium titanate are the well-known piezoelectric materials having respectively a perovskite structure and the piezoelectric materials of various types of compositions, respectively, have been known. For example, one in which a part of elements is absent or in excess, or a part of elements is substituted with other elements, except $BiFeO_3$ and $BaTiO_3$ has been known as bismuth ferrate and barium titanate, however, in a case of being expressed as bismuth ferrate and barium titanate in the invention, bismuth ferrate and barium titanate in which stoicheiometric composition is mismatched due to absence and excess or in which a part of the elements is substituted with other elements are also included in the range of bismuth ferrate and barium titanate as long as basic characteristics are not changed.

The composition of the piezoelectric body layer 70 consisting of the complex oxide having such a perovskite structure, for example, is represented as a mixed crystal which is represented by the general formula (1) described below. In addition, this formula (1) is also represented by the general formula (1') described below. Here, description of the general formula (1) and the general formula (1') is the composition expression based on stoichiometry, naturally, unavoidable mismatch of the compositions due to the lattice mismatch, the oxygen deficiency or the like as well as the partial substitution of elements or the like are permitted as long as it is possible to take a perovskite structure as described above. For example, when the stoichiometric ratio is 1, the stoichiometric ratio within the range of 0.85 to 1.20 is permitted.

$$(1-x)[BiFeO_3]-x[BaTiO_3] \quad (1)$$

$$(0<x<0.40)$$

$$(0<x<0.40)$$

In addition, the complex oxide configuring the piezoelectric body layer 70 may further include elements except Bi, Fe, Ba and Ti. Examples of other elements include, for example, Mn, Co, Cr, or the like. Naturally, in a case of being the complex oxide including other elements, there is a need to have a perovskite structure.

In a case where the piezoelectric body layer 70 includes Mn, Co and Cr, Mn, Co and Cr are the complex oxides having a structure which is located at B site. For example, in a case of including Mn, the complex oxide configuring the piezoelectric body layer 70 is represented as the complex oxide having a structure in which a part of Fe of a solid solution in which bismuth ferrate and barium titanate are uniformly dissolved, is substituted with Mn or a perovskite structure of a mixed crystal of bismuth ferrate manganic acid and barium titanate, basic characteristics are the same as the complex oxide having a perovskite structure of a mixed crystal of bismuth ferrate and barium titanate, however, it has been understood that leakage characteristics are improved. In addition, in a case of including Co and Cr, the leakage characteristics are also improved just as Mn. Here, bismuth ferrate, barium titanate, bismuth ferrate manganic acid, bismuth ferrate cobaltic acid and bismuth ferrate chromic acid are not detected alone in an X-ray diffraction pattern. In addition, description has been given of Mn, Co and Cr as an example, however, it has been understood that the leakage characteristics are similarly improved in a case of including two elements of other transition metal elements at the same time, these are also able to be set as the piezoelectric body layer 70 and furthermore, other well-known additives may be included in order to improve the characteristics.

In addition to such Bi, Fe, Ba and Ti, the piezoelectric body layer 70 consisting of the complex oxide which also includes Mn, Co and Cr and has a perovskite structure, for example, is a mixed crystal which is represented by the general formula (2) described below. In addition, this formula (2) is also represented by the general formula (2') described below. Here, in the general formula (2) and the general formula (2'), M is Mn, Co or Cr. Here, description of the general formula (2) and the general formula (2') is the composition expression based on stoichiometry, unavoidable mismatch of the compositions due to the lattice mismatch, the oxygen deficiency or the like is permitted as long as it is possible to take a perovskite structure as described above. For example, when the stoichiometry is 1, the stoichiometry within range of 0.85 to 1.20 is permitted.

$$(1-x)[Bi(Fe_{1-y}M_y)O_3]-x[BaTiO_3] \quad (2)$$

$$(0<x<0.40, 0.01<y<0.09)$$

$$(0<x<0.40, 0.01<y<0.09)$$

Further, in the invention, it is preferable that the piezoelectric body layer 70 be strongly oriented so as to have a peak in the range of 4.75° to 28.3° when 2θ is fixed within the range of 21.9° to 22.7° to scan in the direction of the χ-axis, and so as to have a peak in the range of 24.8° to 40.75° when 2θ is fixed within the range of 31.1° to 32.6° to scan in the direction of the χ-axis. In this manner, by strongly orienting the piezoelectric body layer on the surface of the predetermined range, it is possible to suppress the occurrence of cracks.

Below, description will be given of a measure using an X-ray diffractometer (XRD), in this description, a (100) surface and a (110) surface are assumed as being cubic, however, being a cubic is not a limitation, and this description is given as a representative, using a case assumed as cubic.

In a measure using XRD, for example, when 2θ is set within the range of 31.1° to 32.6°, which is the position to be observed a peak of the (110) surface to fix the detector, θ which is an angle formed by incidence X-ray and the sample, is set as ½ value of 2θ, an angle is set as χ=0° when not running a scan in the χ-direction which is vertical with respect to the X-ray incidence direction and a scan is run from 0 to 90°, in a case of not orienting and orienting to the (110) surface, detection strength of χ=0° becomes the maximum and this tendency is shown to gradually decrease. On the other hand, in a case where orientation except the (110) surface is a strong orientation, a peak caused by the oriented surface hereof appears. In this manner, it is possible to confirm whether a strong orientation except the (110) surface is present or not. In addition, in order to specify the orientation which is strongly oriented, 2θ is set on the oriented surface except the (110) surface, for example, within the range of 21.9° to 22.7°, which is the position to be observed a peak of the (100) surface to fix the detector, θ which is an angle formed by incidence X-ray and the sample, is set as ½ value of 2θ and a scan in the χ-direction is run from 0 to 90° to obtain a peak position of χ. According to the relationship of an angle between the obtained (100) surface and the strong oriented film and the relationship of an angle between the strong oriented film from the (110) surface, the orientation of the strong oriented film is specified. Here, "strongly oriented" refers to a case where a peak appears at the position except χ=0° in a case of fixing 2θ and θ and running a scan in the χ-direction. Further, the definitions of θ and the χ-direction are as described above, however, are based on the definitions as long as explanation is not particularly given in this case.

In addition, each second electrode 80 which is an individual electrode of such a piezoelectric element 300 are extracted from the vicinity of the edge of the ink supply route 14 side and are extendedly provided on the elastic film 50 or the insulator film which is arranged as necessary. For example, a lead electrode 90 consisting of gold (Au) or the like is connected.

On the channel formation substrate 10 in which such a piezoelectric element 300 is formed, in other words, on the first electrode 60, the elastic film 50, the insulator film which is arranged as necessary and the lead electrode 90, the protective substrate 30 having a manifold unit 31 configuring at least a part of a manifold 100 is joined through the adhesion agent 35. This manifold unit 31, in the embodiment, is pierced in thickness direction of the protective substrate 30 and is formed throughout the width direction of the pressure generating chamber 12, and configures the manifold 100 which becomes a common ink chamber of each pressure generating chamber 12 by communicating with the communicating unit 13 of the channel formation substrate 10 described above. In addition, the communicating unit 13 of the channel formation substrate 10 may be plurally divided at each pressure generating chamber 12 and only the manifold unit 31 is set as a manifold. Furthermore, for example, only the pressure generating chamber 12 is arranged on the channel formation substrate 10 and the ink supply route 14 which communicates with the manifold 100 and each pressure generating chamber 12 may be arranged on the member (for example, the elastic film 50, the insulator film which is arranged as necessary or the like) which lies between the channel formation substrate 10 and the protective substrate 30.

In addition, in the area opposing the piezoelectric element 300 of the protective substrate 30, a piezoelectric element maintaining unit 32 having a space of the degree which does not impede the movement of the piezoelectric element 300 is arranged. The piezoelectric element maintaining unit 32 may have the space of the degree which does not impede the movement of the piezoelectric element 300 and the space may be hermetically closed or may not be hermetically closed.

As such a protective substrate 30, a material which has almost the same coefficient of thermal expansion of the channel formation substrate 10, for example, a glass, a ceramic material or the like is preferably used and, in the embodiment, a silicon single crystal substrate which is the same material as the channel formation substrate 10 was used to form a protective substrate 30.

In addition, a through hole 33 which is pierced in thickness direction of the protective substrate 30, is arranged on the protective substrate 30. Further, the vicinity of the edge of the lead electrode 90 which is extracted from each piezoelectric element 300 is arranged so as to be exposed in the through hole 33.

In addition, a drive circuit 120 for driving the piezoelectric element 300 which is arranged in parallel on the protective substrate 30 is fixed. As this drive circuit 120, for example, a circuit substrate and a semiconductor integrated circuit (IC), or the like may be used. Further, the drive circuit 120 and the lead electrode 90 are electrically connected through a connector wiring 121 consisting of a conductive wire such as a bonding wire.

In addition, a compliance substrate 40 consisting of a sealing film 41 and a stationary plate 42 is joined on such a protective substrate 30. Here, the sealing film 41 consists of a material having the flexibility with low hardness and one surface of the manifold unit 31 is sealed by this sealing film 41. In addition, the stationary plate 42 is formed by a relatively hard material. Since the area opposing the manifold 100 of the stationary plate 42 is set as an opening unit 43 which is completely removed in the thickness direction, only sealing film 41 having flexibility is sealed on one surface of the manifold 100.

In an ink jet recording head I in such an embodiment, after an ink is taken in from an ink installation port connected with an exterior ink supply unit (not shown) and the inside from the manifold 100 to the nozzle opening 21 is filled with an ink, by applying a voltage between each of the first electrode 60 and the second electrode 80 corresponding with the pressure generating chamber 12 in accordance with a recording signal from the drive circuit 120 and by deforming deflection the elastic film 50, the adhesion layer 56, the first electrode 60 and the piezoelectric body layer 70, the pressure in each pressure generating chamber 12 increases, therefore ink drops are discharged from the nozzle opening 21.

Next, description will be given of an example of a method of manufacturing of an ink jet recording head in the embodiment with reference to FIG. 4A to FIG. 8B. Here, FIG. 4A to FIG. 8B are sectional views in a longitudinal direction of a pressure generating chamber.

Figure 4A:
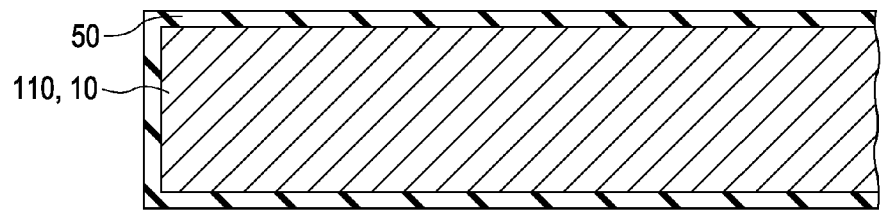
FIGS. 4A and 4B are sectional views showing a manufacturing process of a recording head according to a first embodiment of the invention.
Figure 4B:
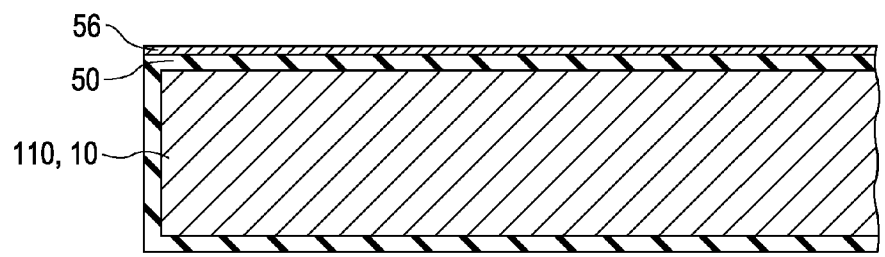

Firstly, a silicon dioxide film consisting of silicon dioxide ($SiO_2$) or the like, configuring the elastic film 50, is formed on the surface of a wafer for channel formation substrate 110 which is a silicon wafer using thermal oxidation or the like as shown in FIG. 4A. Next, the adhesion layer 56 consisting of titanium oxide or the like is formed on the elastic film 50 (a silicon dioxide film) using a sputtering method, thermal oxidation or the like as shown in FIG. 4B.

Figure 5A:
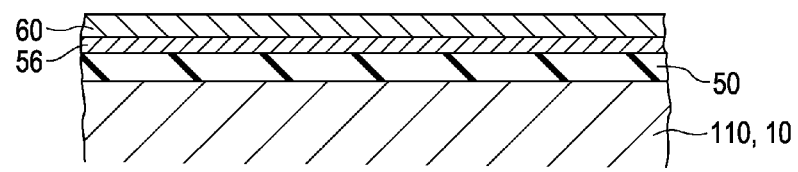
FIGS. 5A to 5C are sectional views showing a manufacturing process of a recording head according to a first embodiment of the invention.
Figure 5B:
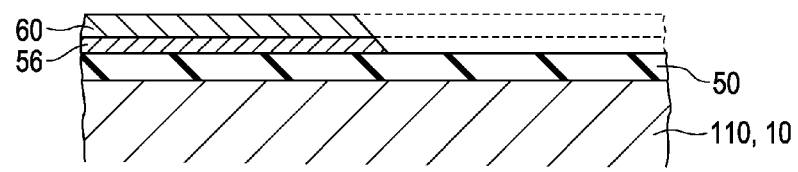

Next, the first electrode 60 consisting of platinum, iridium, iridium oxide, a laminate structure thereof or the like is formed using a sputtering method, an evaporation method or the like all over the adhesion layer 56 as shown in FIG. 5A. Next, a resist (not shown) of the predetermined shape on the first electrode 60 is set as a mask and a patterning is conducted at the same time so as to be descended the side of the adhesion layer 56 and the first electrode 60 as shown in FIG. 5B.

Next, after peeling off the resist, the piezoelectric body layer 70 is laminated on this first electrode 60. A method of manufacturing of the piezoelectric body layer 70 is not particularly limited, however, for example, it is possible to manufacture the piezoelectric body layer 70 using a chemical solution method such as Metal-Organic Decomposition (MOD) method, sol-gel method or the like which obtains a piezoelectric body layer (piezoelectric body film) consisting of a metallic oxide by applying and drying a solution including a metal complex and calcining with a higher temperature. Besides these, it is also possible to manufacture the piezoelectric body layer 70 using a gas phase method, a liquid phase method and a solid phase method such as a laser ablation method, a sputtering method, a pulsed laser deposition method (PLD method), a CVD method or an aerosol deposition method.

Figure 5C:
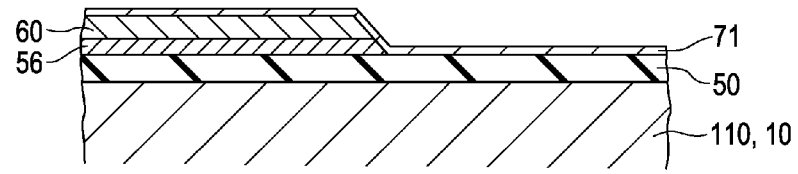

As specific examples of the formation procedure in a case of forming the piezoelectric body layer 70 using a chemical solution method, firstly, a MOD solution including a metal complex, specifically, a metal complex having Bi, Fe, Ba and Ti on the first electrode 60 and a composition for the piezoelectric body film formation (precursor solution) consisting of sol are applied to form a piezoelectric body precursor film 71 using spin coating method or the like as shown in FIG. 5C (application process).

The precursor solution to be applied is a solution in which a metal complex which is able to form a complex oxide including Bi, Fe, Ba and Ti is mixed by calcining and the mixture is dissolved or dispersed in an organic solvent. In addition, in a case of forming the piezoelectric body layer 70 consisting of a complex oxide including Mn, Co or Cr, the precursor solution including a metal complex further having Mn, Co or Cr is used. The mixing ratio of a metal complex including Bi, Fe, Ba and Ti respectively and a metal complex having Mn, Co or Cr to be mixed as necessary may be to mix so that each metal has the desired mole ratio. As a metal complex including Bi, Fe, Ba, Ti, Mn, Co or Cr respectively, for example, an alkoxide, an organic acid salt, a β diketone complex, or the like may be used. Examples of the metal complex including Bi include, for example, bismuth octoate, bismuth acetate, or the like. Examples of the metal complex including Fe include, for example, iron octylate, iron acetate, iron tris(acetylacetonato), or the like. Examples of the metal complex including Ba include, for example, barium isopropoxide, barium octylate, barium acetylacetonate, or the like. Examples of the metal complex including Ti include, for example, titanium isopropoxide, titanium octylate, titanium (di-i-propoxide)bis(acetylacetonate), or the like. Examples of the metal complex including Mn include, for example, manganese octylate, manganese acetate, or the like. Examples of the metal complex including Co include, for example, cobalt octylate, cobalt (III) acetylacetonate, or the like. Examples of the organometallic compound including Cr include chromium octylate or the like. Naturally, a metal complex including two kinds or more of Bi, Fe, Ba and Ti, or Mn, Co and Cr to be included as necessary may be used. In addition, examples of the solvent for the precursor solution include propanol, butanol, pentanol, hexanol, octanol, ethylene glycol, propylene glycol, octane, decane, cyclohexane, xylene, toluene, tetrahydrofuran, acetic acid, octyl acid, or the like.

Next, a piezoelectric body precursor film 71 is heated up to the predetermined temperature (for example, 150 to 200° C.) and dried for a definite period of time (drying process). Next, by the dried piezoelectric body precursor film 71 being heated up to the predetermined temperature (for example, 350 to 450° C.) and maintained for a definite period of time, degreasing is conducted (degreasing process). Degreasing referred here is to withdraw an organic constituent included in the piezoelectric body precursor film 71, for example, as $NO_2$, $CO_2$, $H_2O$ or the like. An atmosphere of drying process and degreasing process is not limited, and may be in an atmosphere, in an oxide atmosphere or in an inert gas. Here, applying process, drying process and degreasing process may be conducted several times.

Figure 6A:
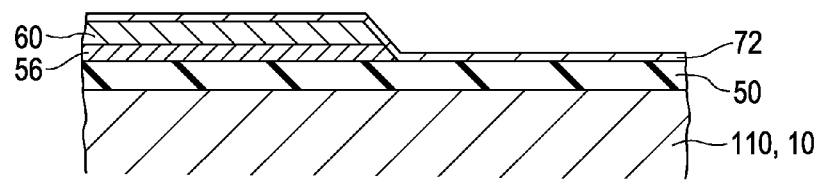
FIGS. 6A and 6B are sectional views showing a manufacturing process of a recording head according to a first embodiment of the invention.

Next, the piezoelectric body precursor film 71 is crystallized by heating up to the predetermined temperature, for example, approximately 600 to 850° C. and maintaining for a definite period of time, for example, for 1 to 10 min and a piezoelectric body film 72 consisting of a complex oxide which includes bismuth, iron, barium and titanium and has a perovskite structure is formed as shown in FIG. 6A (calcining process). In this calcining process, an atmosphere is not limited, and may be in an atmosphere, in an oxide atmosphere or in an inert gas. Examples of the heating apparatus used in drying process, degreasing process and calcining process, for example, include a Rapid Thermal Annealing (RTA) apparatus which heats by irradiation of an infrared lamp, a hotplate or the like.

Figure 6B:
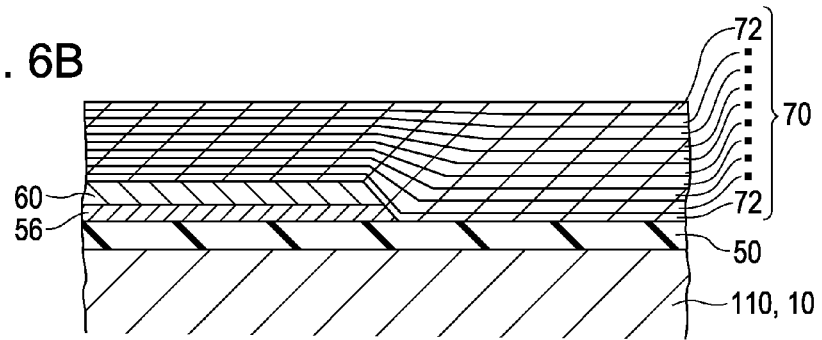

Next, by forming the piezoelectric body layer 70 consisting of a plurality of piezoelectric body films 72, by applying process, drying process and degreasing process described above or by conducting applying process, drying process, degreasing process and calcining process several times depending on the desired film thickness, the piezoelectric body layer 70 having the predetermined thickness consisting of the piezoelectric body films 72 of the multilayers, is formed as shown in FIG. 6B.

In this manner, after forming the piezoelectric body layer 70, the second electrode 80 consisting of platinum or the like is formed using a sputtering method or the like on the piezoelectric body layer 70, patterning of the piezoelectric body layer 70 and the second electrode 80 is conducted at the same time in the area opposing each pressure generating chamber 12 and the piezoelectric element 300 consisting of the first electrode 60, the piezoelectric body layer 70 and the second electrode 80 is formed as shown in FIG. 7A. Here, in patterning of the piezoelectric body layer 70 and the second electrode 80, it is possible to conduct together by conducting dry etching through a resist (not shown) formed in the predetermined shape. Afterward, as necessary, for example, annealing may be conducted in the temperature range of 600 to 850° C. In this manner, it is possible to form an excellent interface between the piezoelectric body layer 70 and the first electrode 60 or the second electrode 80 and improve the crystalline of the piezoelectric body layer 70.

Next, patterning of all over the wafer for channel formation substrate 110 is conducted in each piezoelectric element 300, for example, through a mask pattern (not shown) consisting of a resist or the like, for example, after forming the lead electrode 90 consisting of gold (Au) or the like as shown in FIG. 7B.

Next, after a wafer for protective substrate 130 which is a silicon wafer and becomes a plurality of protective substrates 30 is joined through the adhesion agent 35 at the piezoelectric element 300 side of the wafer for channel formation substrate 110, the wafer for channel formation substrate 110 is thinned down to the predetermined thickness as shown in FIG. 7C.

Figure 8A:
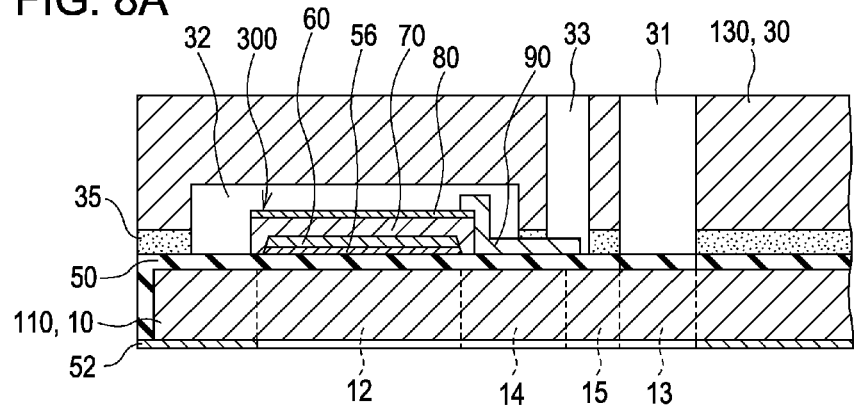
FIGS. 8A and 8B are sectional views showing a manufacturing process of a recording head according to a first embodiment of the invention.

Next, a mask film 52 is newly formed on the wafer for channel formation substrate 110 to conduct a patterning into the predetermined shape as shown in FIG. 8A.

Figure 8B:
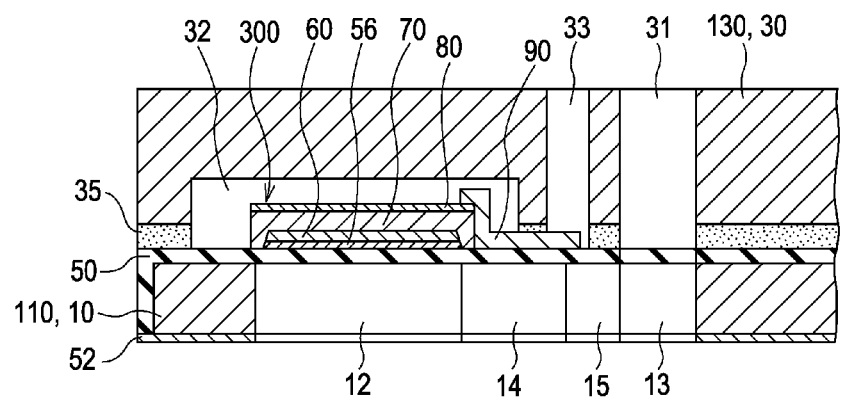
Figure 9A:
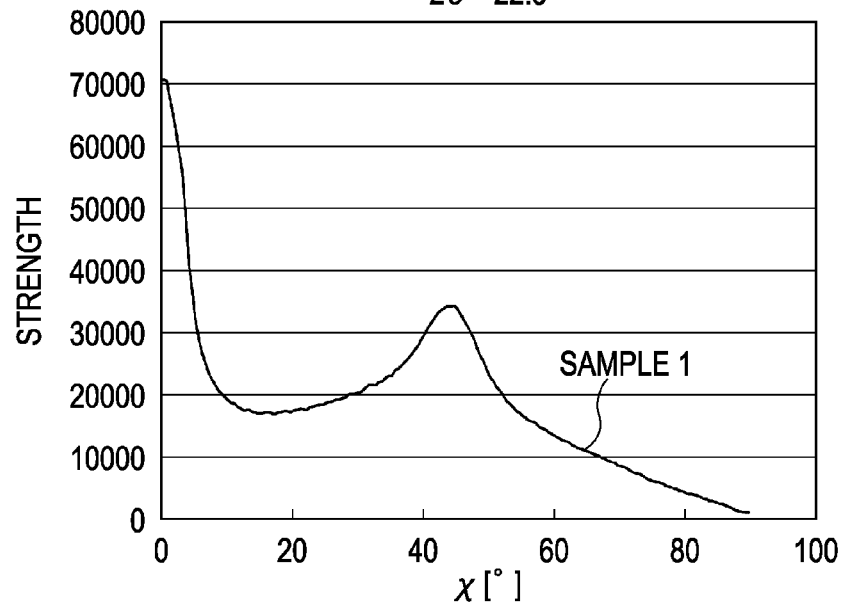
FIGS. 9A and 9B are angular dependence views in the χ-direction at the position of 2θ=22.5° and 32.0°.
Figure 9B:
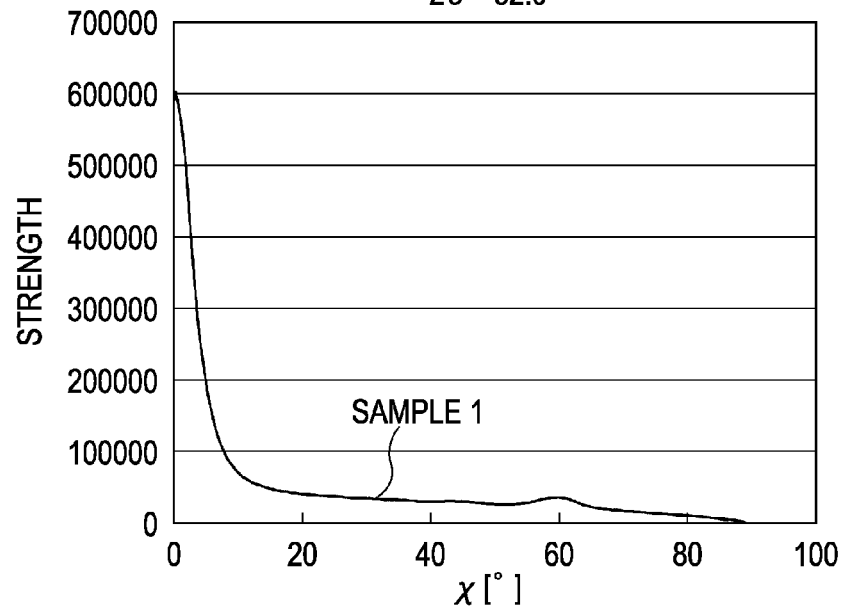
Figure 10A:
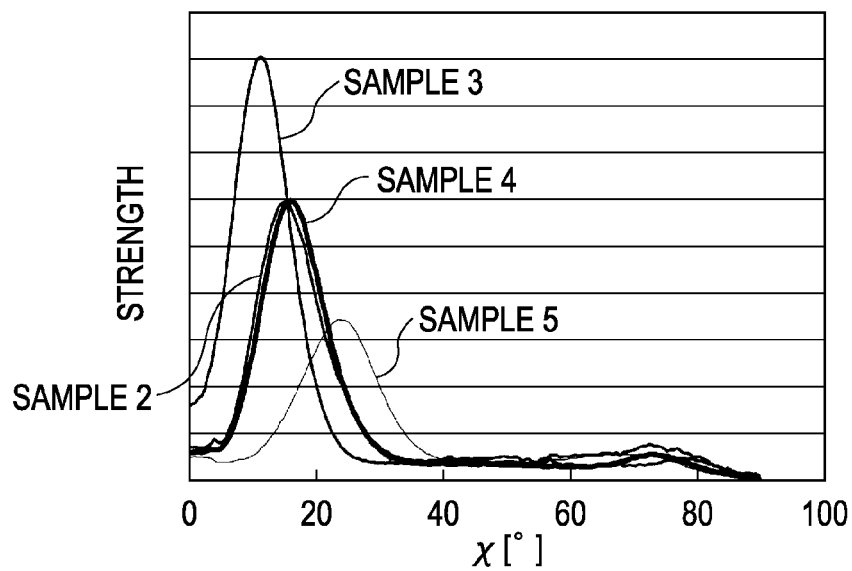
FIGS. 10A and 10B are angular dependence views in the χ-direction at the position of 2θ=22.5° and 32.0°.
Figure 10B:
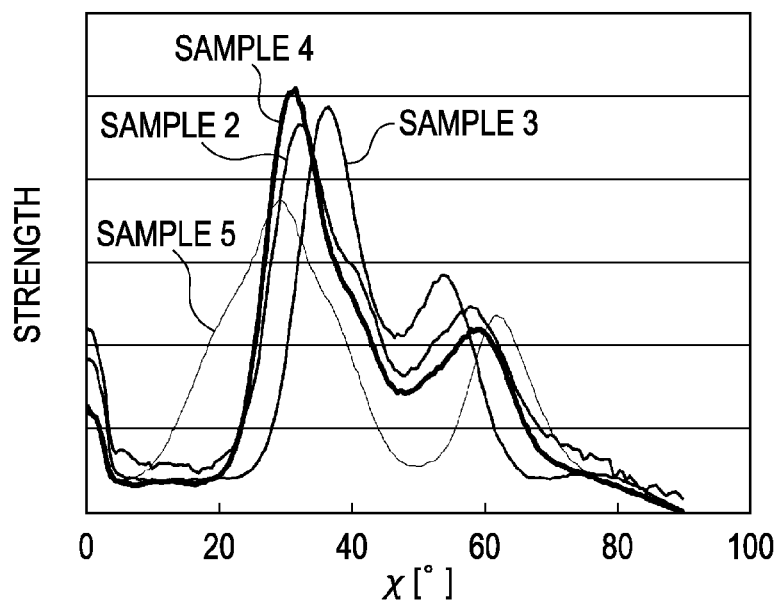
Figure 11A:
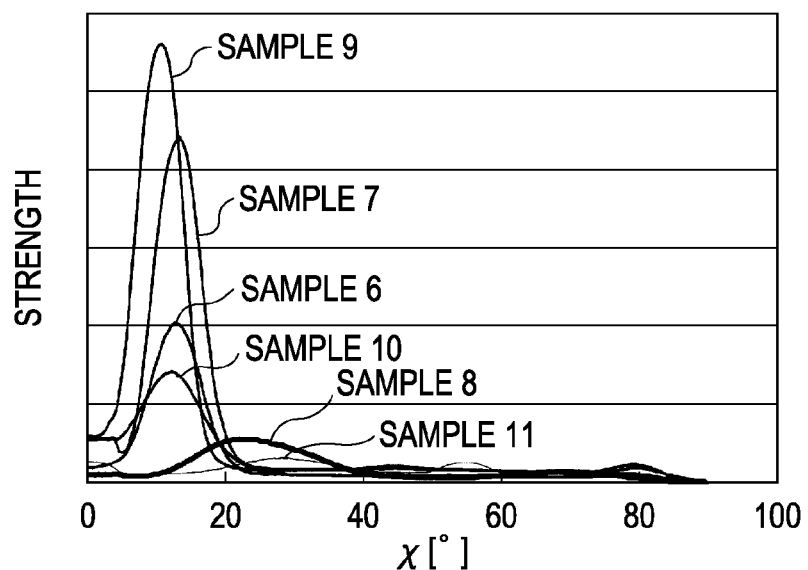
FIGS. 11A and 11B are angular dependence views in the χ-direction at the position of 2θ=22.5° and 32.0°.
Figure 11B:
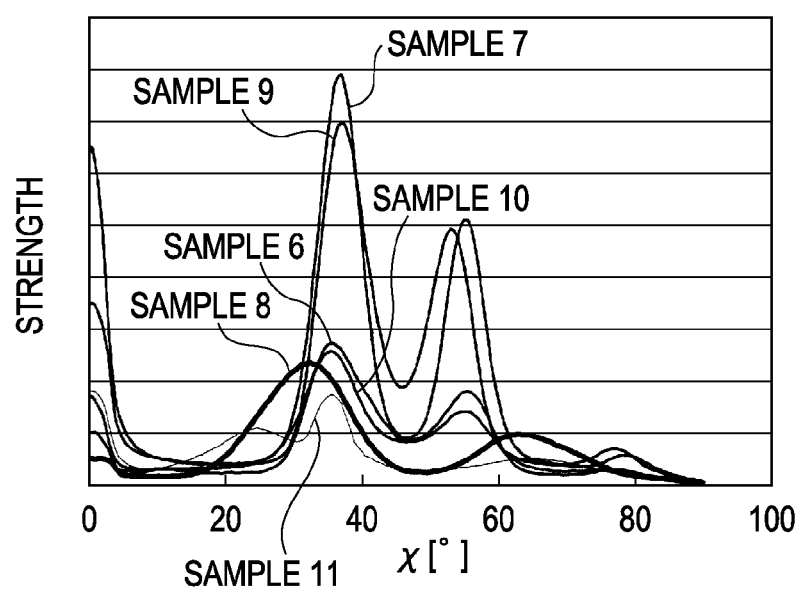
Figure 12A:
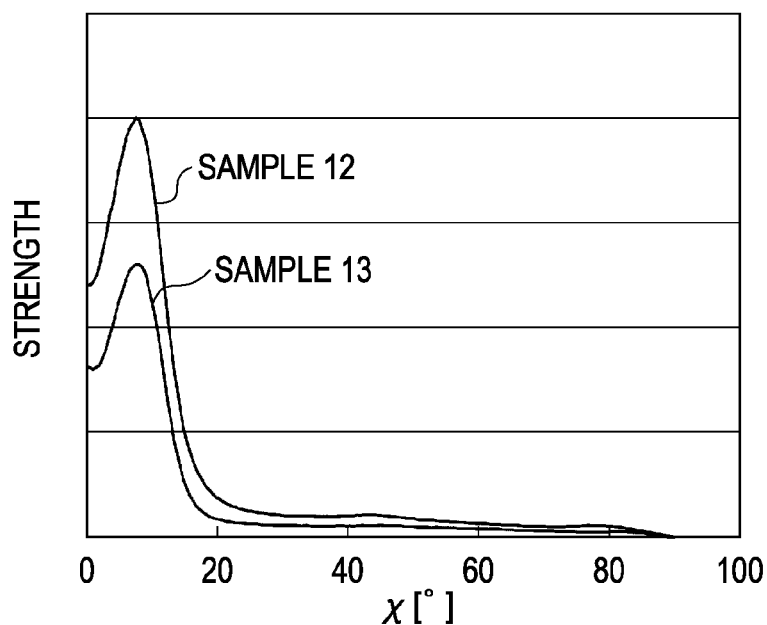
FIGS. 12A and 12B are angular dependence views in the χ-direction at the position of 2θ=22.5° and 32.0°.
Figure 12B:
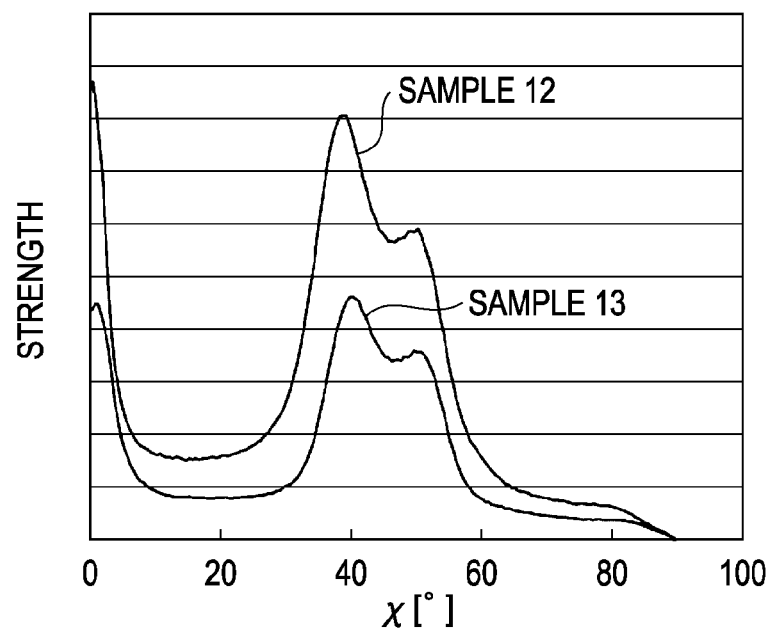
Figure 13A:
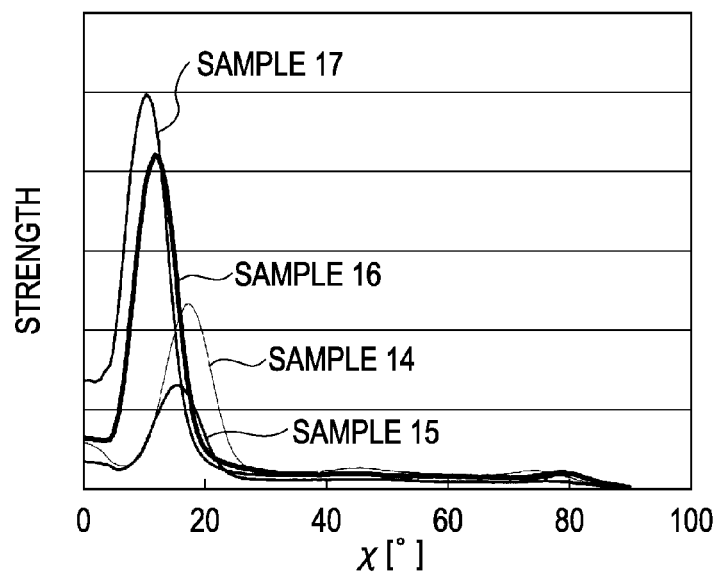
FIGS. 13A and 13B are angular dependence views in the χ-direction at the position of 2θ=22.5° and 32.0°.
Figure 13B:
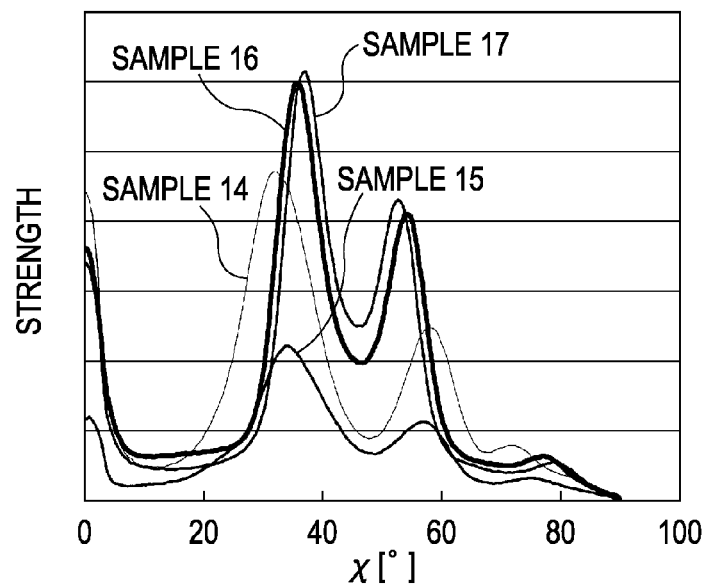

Then, by conducing anisotropic etching (wet etching) of the wafer for channel formation substrate 110 through the mask film 52 using an alkaline solution such as KOH, the pressure generating chamber 12, the communicating unit 13, the ink supply route 14, the communicating route 15, and the like corresponding with the piezoelectric element 300 are formed as shown in FIG. 8B.

Afterward, unwanted parts of a peripheral edge of the wafer for channel formation substrate 110 and the wafer for protective substrate 130 are removed, for example, by cutting using dicing or the like. Further, after the mask film 52 on the surface of the opposite side with respect to the wafer for protective substrate 130 of the wafer for channel formation substrate 110, is removed, by joining the nozzle plate 20 piercing the nozzle opening 21 as well as joining the compliance substrate 40 to the wafer for protective substrate 130 and dividing the wafer for channel formation substrate 110 or the like into the channel formation substrate 10 of one chip size or the like as shown in FIG. 1, an ink jet recording head I in the embodiment is set.

Example

Hereinafter, specific description will be given of the invention showing examples. Here, this invention is not limited to the examples as below.
Samples 1 to 18
Firstly, a silicon oxide ($SiO_2$) film was formed on the surface of a (100) single crystal silicon (Si) substrate using thermal oxidation. Next, a titanium film of thickness of 40 nm was prepared on the $SiO_2$ film using RF magnetron sputtering method and a titanium oxide film was formed by thermal oxidation. Next, a platinum film (first electrode 60) of the thickness of 100 nm orienting on the (111) surface was formed on the titanium oxide film using RF magnetron sputtering method.

Next, as a bottom layer of the piezoelectric body layer 70 on the first electrode 60, a buffer layer was formed using a spin coating method. The method is as follow. Firstly, bismuth 2-ethylhexanoate, iron 2-ethylhexanoate, barium 2-ethylhexanoate, titanium 2-ethylhexanoate, cobalt 2-ethylhexanoate, zinc 2-ethylhexanoate, nickel 2-ethylhexanoate and n-octane solution were mixed so as to be the mole ratio and the concentration indicated in table 1 to set as a buffer layer precursor solution. The mole ratio of the piezoelectric body precursor solution was set as Bi:Ba:Fe:Ti:Mn=75:25:71.25:25:3.75.

Then, by dropping the precursor solution of this buffer layer onto the first electrode 60 of the substrate and spinning the substrate with 3,000 rpm, a buffer layer precursor film was formed using a spin coating method (applying process). Next, the substrate was placed on the hotplate and was dried for 2 minutes at 180° C. (drying process). Then, degreasing was conducted for 2 minutes at 450° C. (degreasing process). After that, calcining was conducted using a Rapid Thermal Annealing (RTA) apparatus in an oxide atmosphere (calcining process). In calcining process, the calcining temperature and the rate of temperature rise of an RTA apparatus are as indicated in table 1.

Next, applying process using the piezoelectric body precursor solution described above, drying process of drying for 2 minutes at 180° C. on the hotplate, degreasing process for 2 minutes at 350° C. and calcining process at 750° C. were conducted. With regard to the procedure, after applying process, drying process and degreasing process were conducted twice, calcining process was conducted and these are repeated four times.

As a result, due to applying a total of 10 times which were once of the buffer layer and 9 times of the piezoelectric body film, the piezoelectric body layers 70 of samples 2 to 18 including buffer layers of the overall thickness of 700 nm were formed. Here, sample 1 is that the piezoelectric body layer is formed without arranging buffer layers to be compared.

After that, after a platinum film of the thickness of 100 nm as the second electrode 80 was formed on the piezoelectric body layer 70 using a sputtering method, by conducting calcining for 5 minute at 750° C. using an RTA apparatus in an oxide atmosphere, the piezoelectric element possessing the piezoelectric body layer 70 consisting of a complex oxide which is represented as a mixed crystal of bismuth ferrate manganic acid and barium titanate, was formed.

Samples 19 and 20

With regard to sample 19, in the same manner as samples described above, after the buffer layer was produced by compositions indicated in table 1 described below, 2-nbutoxyethanol was set as a main solvent, titanium tetraisopropoxide, tetra-n-propoxyzirconium and lead acetate were set as a main material, and by using the precursor solution which is obtained by mixing diethanlol amine as a stabilization agent, the piezoelectric body layer was formed.

With regard to sample 20, in the same manner as samples described above, after the buffer layer is produced by compositions indicated in table 1 described below, the precursor solution consisting of a butanol solution in which the organometallic compounds of bismuth, sodium and titanium were dissolved by Bi:Na:Ti=50:50:100, was used and the piezoelectric body layer was formed.

Test Sample 1

With regard to the piezoelectric body layer of each sample 1 to 18, when 2θ and θ were fixed using PANalytical's "X'pert PRO MRD", the measure of χ-direction and the measure of broad reciprocal lattice mapping were conducted and the results are shown in FIG. 9 to FIG. 16.

Figure 14A:
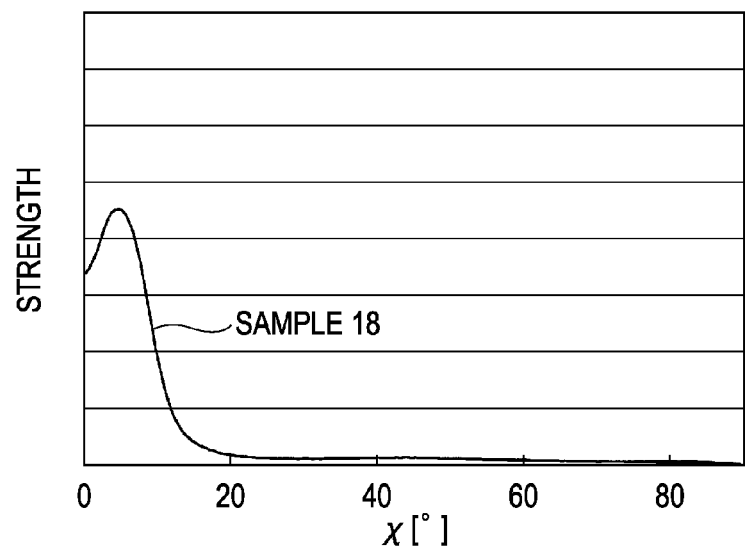
FIGS. 14A and 14B are angular dependence views in the χ-direction at the position of 2θ=22.5° and 32.0°.
Figure 14B:
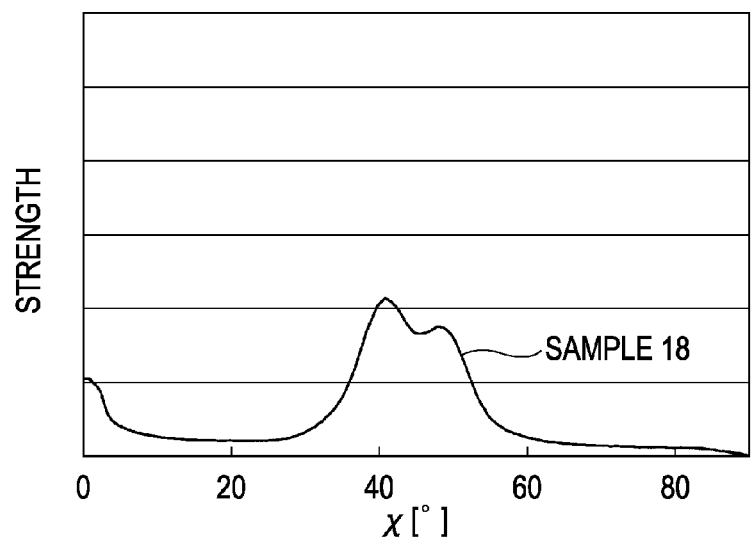

In A of FIG. 9A to FIG. 14B, in a case where the piezoelectric body layer 70 was (100) oriented, when 2θ and θ were fixed as 2θ=22.5° and θ=11.25° which was the position to be obtained a diffraction peak and scan was conducted in χ-direction, the measurement result is shown, in B, in a case where the piezoelectric body layer 70 was (110) oriented, when 2θ and θ were fixed as 2θ=32.0° and θ=16.0° which was the position to be obtained a diffraction peak and scan was conducted in χ-direction, the measurement result is shown. In addition, the angular dependence with regard to sample 1 for FIGS. 9A and 9B, samples 2 to 5 for FIGS. 10A and 10B, samples 6 to 11 for FIGS. 11A and 11B, samples 12 and 13 for FIGS. 12A and 12B, samples 14 to 17 for FIGS. 13A and 13B and sample 18 for FIGS. 14A and 14B is shown.

Figure 15A:
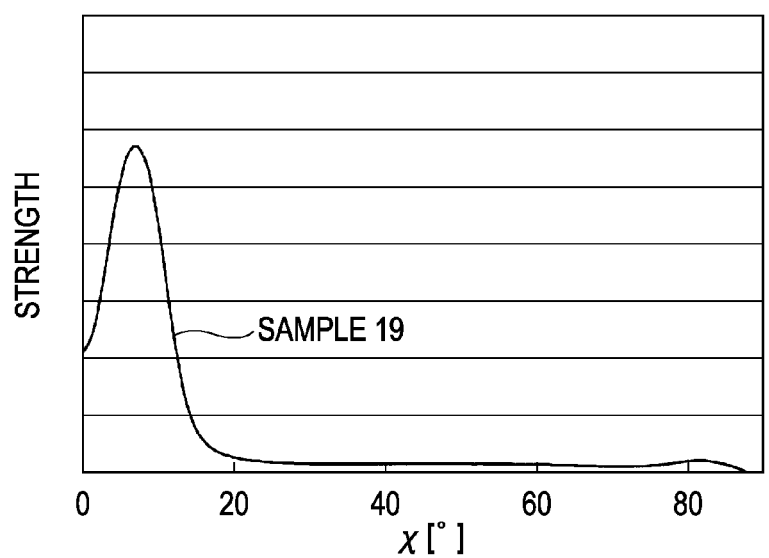
FIGS. 15A and 15B angular dependence views in the χ-direction at the position of 2θ=21.9° and 31.1°.
Figure 15B:
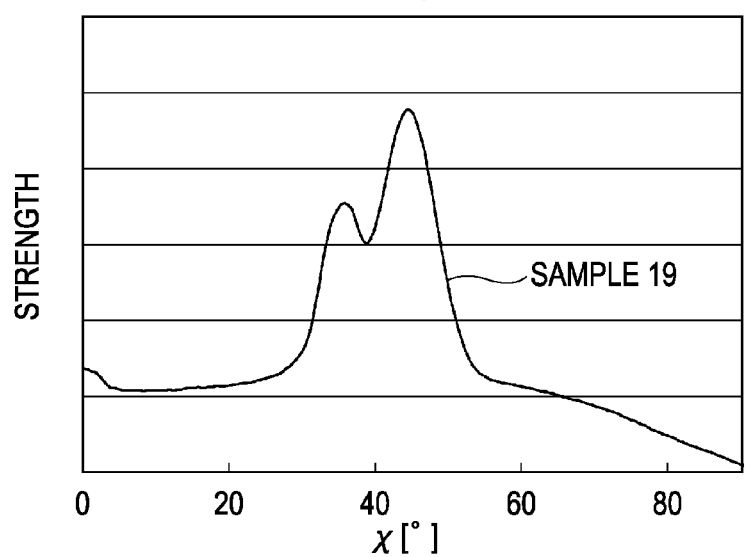

In addition, FIGS. 15A and 15B is the measurement result of sample 19, in FIG. 15A, in a case where the piezoelectric body layer 70 was (100) oriented, when 2θ and θ were fixed as 2θ=21.9° and θ=10.95° which was the position to be obtained a diffraction peak and scan was conducted in χ-direction, the measurement result is shown, in FIG. 15B, in a case where the piezoelectric body layer 70 was (110) oriented, when 2θ and θ were fixed as 2θ=31.1° and θ=15.55° which was the position to be obtained a diffraction peak and scan was conducted in χ-direction, the measurement result is shown.

Figure 16A:
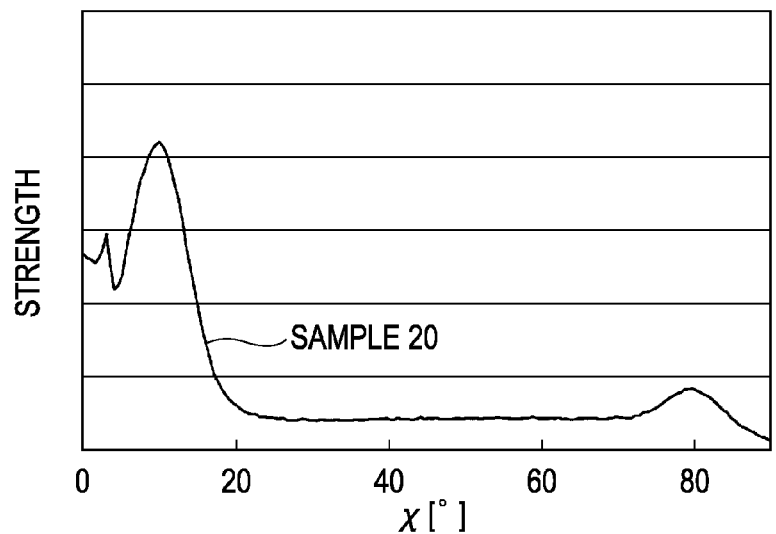
FIGS. 16A and 16B are angular dependence views in the χ-direction at the position of 2θ=22.7° and 32.6°.
Figure 16B:
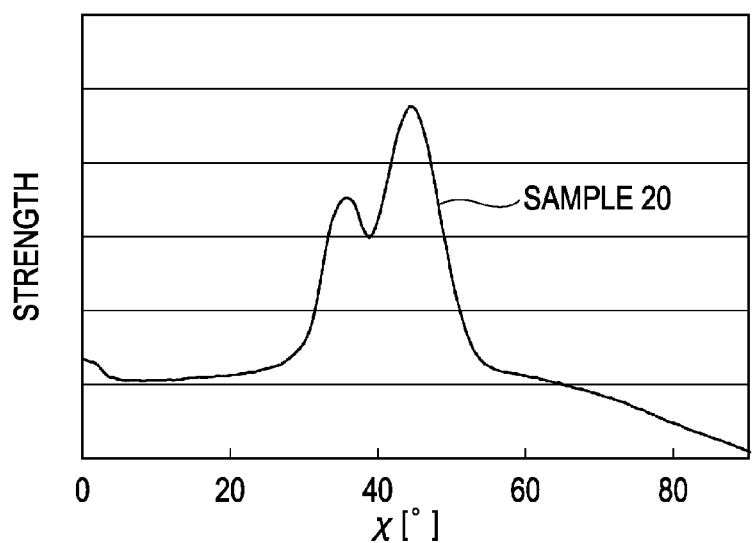

In addition, FIGS. 16A and 16B is the measurement result of sample 20, in FIG. 16A, in a case where the piezoelectric body layer 70 was (100) oriented, when 2θ and θ were fixed as 2θ=22.7° and θ=11.35° which was the position to be obtained a diffraction peak and scan was conducted in χ-direction, the measurement result is shown, in FIG. 16B, in a case where the piezoelectric body layer 70 was (110) oriented, when 2θ and θ were fixed as 2θ=32.6° and θ=16.3° which was the position to be obtained a diffraction peak and scan is conducted in χ-direction, the measurement result is shown.

Further, in FIG. 17, a broad reciprocal lattice mapping of sample 17 is shown. The position in which the surface formed by incident axis and reflective axis of an X-ray and the sample are vertical, is set as χ=0°.

From a broad reciprocal lattice mapping (a broad reciprocal lattice mapping of sample 17 is shown as a representative in FIG. 17), from the fact that 2θ is 22.5° and 32° and a peak is seen at either place in χ-direction as a spot in samples 2 to 18, it was understood that a perovskite was oriented in either direction. In addition, from the fact that 2θ is 21.9° and 31.1° and a peak is seen at either place in χ-direction as a spot in sample 19, it was understood that a perovskite was oriented in either direction. Furthermore, from the fact that 2θ is 22.7° and 32.6° and a peak is seen at either place in χ-direction as a spot in sample 20, it was understood that a perovskite was oriented in either direction.

Further, with respect to each sample 1 to 20, respectively, of FIGS. 9A, 10A, 11A, 12A, 13A, 14A, 15A, and 16A, χ value which became a peak was evaluated and in a case where there were a plurality of peaks, the value which the χ was the minimum, was shown in table 1. This evaluated angle of χ indicates a slope angle between crystal orientation in a case where the piezoelectric body layer 70 is (100) oriented and crystal orientation of the sample thereof.

In addition, with respect to each sample 1 to 20, respectively, of FIGS. 9B, 10B, 11B, 12B, 13B, 14B, 15B, and 16B, χ value which became a peak was evaluated and in a case where there were a plurality of peaks, the value which the χ was the minimum, was shown in table 1. This evaluated angle of χ indicates a slope angle between crystal orientation in a case where the piezoelectric body layer 70 is (110) oriented and crystal orientation of the sample thereof.

As a result, it was understood that samples 2 to 20 were strongly oriented on the surface which leans to 4.75° to 28.3° from the (100) oriented film and leans to 24.8° to 40.75° from the (110) oriented film. In addition, it was understood that sample 1 in which the buffer layer was not arranged was strongly oriented to the (110) orientation.

In addition, according to the relationship between each crystal orientation and the slope angle obtained by measurement, the piezoelectric body layer 70 was set as a cubic, the orientations of the each sample was evaluated and were shown in table 1.

TABLE 1

| | Piezoelectric body layer | Buffer layer | | | | | | | | | | Measurement result | | |
|---|---|---|---|---|---|---|---|---|---|---|---|---|---|---|
| | | Mole ratio of precursor solution | | | | | | | Calcining temperature (°C.) | Programming rate (° C./sec) | Concentration (mol/l) set an atom of A site as a standard | Analysis result | | |
| | | Bi | Ba | Fe | Ti | Mn | Co | Ni | Zn | | | | χ (°) of A in FIG. 9A to FIG. 16B | χ (°) of B in FIG. 9A to FIG. 16B | orientation |
| Sample 1 | BFO-BT | — | — | — | — | — | — | — | — | 750 | 400 | 0.25 | 44.8 | 0.0 | (1 1 0) |
| Sample 2 | BFO-BT | 7.5 | 50 | 42.5 | 3.75 | 0 | 0 | 0 | 3.75 | 650 | 300 | 0.25 | 14.7 | 32.4 | (17 4 2) |
| Sample 3 | BFO-BT | 7.5 | 50 | 42.5 | 3.75 | 0 | 0 | 0 | 3.75 | 650 | 1 | 0.25 | 11.4 | 37.6 | (7 1 1) |
| Sample 4 | BFO-BT | 7.5 | 50 | 42.5 | 3.75 | 0 | 0 | 0 | 3.75 | 650 | 300 | 0.25 | 15.8 | 30.8 | (19 5 2) |
| Sample 5 | BFO-BT | 7.5 | 50 | 42.5 | 3.75 | 0 | 0 | 0 | 3.75 | 650 | 300 | 0.125 | 23.5 | 29.1 | (23 8 6) |
| Sample 6 | BFO-BT | 3.5 | 50 | 46.5 | 1.75 | 0 | 1.75 | 0 | 0 | 650 | 300 | 0.25 | 15.5 | 31.5 | (8 2 1) |
| Sample 7 | BFO-BT | 3.5 | 50 | 46.5 | 1.75 | 0 | 1.75 | 0 | 0 | 750 | | 0.25 | 12.9 | 35.4 | (6 1 1) |
| Sample 8 | BFO-BT | 0 | 48 | 48 | 0 | 0 | 4 | 0 | 0 | 750 | 400 | 0.25 | 13.1 | 36.5 | (6 1 1) |
| Sample 9 | BFO-BT | 7.5 | 50 | 42.5 | 3.75 | 0 | 3.75 | 0 | 0 | 750 | 400 | 0.25 | 23.0 | 32.1 | (10 3 3) |
| Sample 10 | BFO-BT | 4 | 50 | 46 | 0 | 0 | 4 | 0 | 0 | 750 | 400 | 0.25 | 10.5 | 37.0 | (27 4 3) |
| Sample 11 | BFO-BT | 3.5 | 50 | 46.5 | 1.75 | 0 | 1.75 | 0 | 0 | 750 | 1 | 0.25 | 12.0 | 35.1 | (17 3 2) |
| Sample 12 | BFO-BT | 3.5 | 50 | 46.5 | 0 | 3.5 | 0 | 0 | 0 | 650 | 300 | 0.25 | 7.2 | 36.7 | (15 2 0) |
| Sample 13 | BFO-BT | 3.5 | 50 | 46.5 | 0 | 3.5 | 0 | 0 | 0 | 750 | 400 | 0.25 | 7.3 | 41.1 | (11 1 1) |
| Sample 14 | BFO-BT | 3.5 | 50 | 46.5 | 1.75 | 0 | 0 | 1.75 | 0 | 650 | 300 | 0.25 | 17.4 | 32.5 | (16 4 3) |
| Sample 15 | BFO-BT | 3.5 | 50 | 46.5 | 1.75 | 0 | 0 | 1.75 | 0 | 750 | 400 | 0.25 | 15.6 | 34.0 | (23 5 4) |
| Sample 16 | BFO-BT | 2 | 50 | 48 | 0 | 0 | 0 | 2 | 0 | 750 | 400 | 0.25 | 12.0 | 35.5 | (17 3 2) |
| Sample 17 | BFO-BT | 0 | 49 | 49 | 0 | 0 | 0 | 2 | 0 | 750 | 400 | 0.25 | 10.2 | 36.8 | (20 3 2) |
| Sample 18 | BFO-BT | 3.5 | 50 | 46.5 | 0 | 3.5 | 0 | 0 | 0 | 650 | 300 | 0.125 | 4.8 | 40.8 | (27 2 1) |
| Sample 19 | PZT | 7.5 | 50 | 42.5 | 3.75 | 0 | 0 | 0 | 3.75 | 650 | 1 | 0.25 | 7.3 | 36.3 | — |
| Sample 20 | ((Bi, Na)TiO$_3$) | 4.5 | 50 | 45.5 | 0 | 4.5 | 0 | 0 | 0 | 750 | 400 | 0.25 | 10.8 | 36.3 | (25 4 2) |

Test Sample 2

Figure 18A:
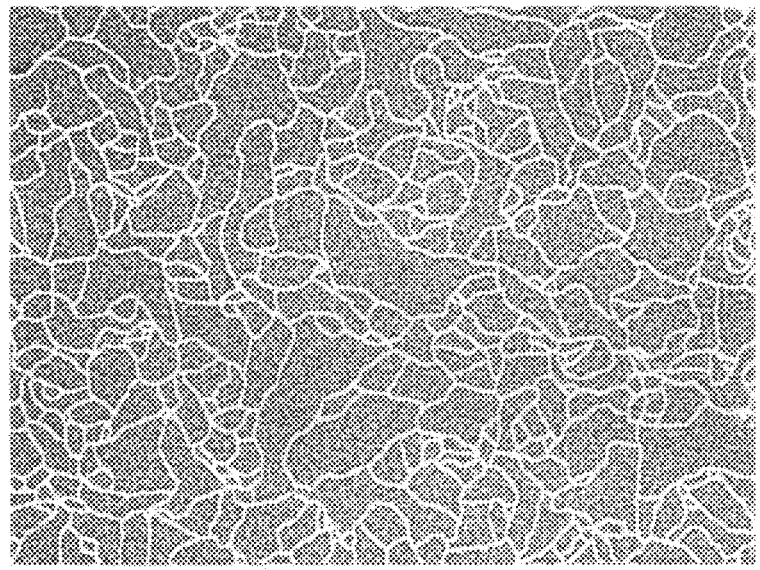
FIGS. 18A and 18B are photographs observing the surface of piezoelectric body layers of samples 1 and 17.
Figure 18B:
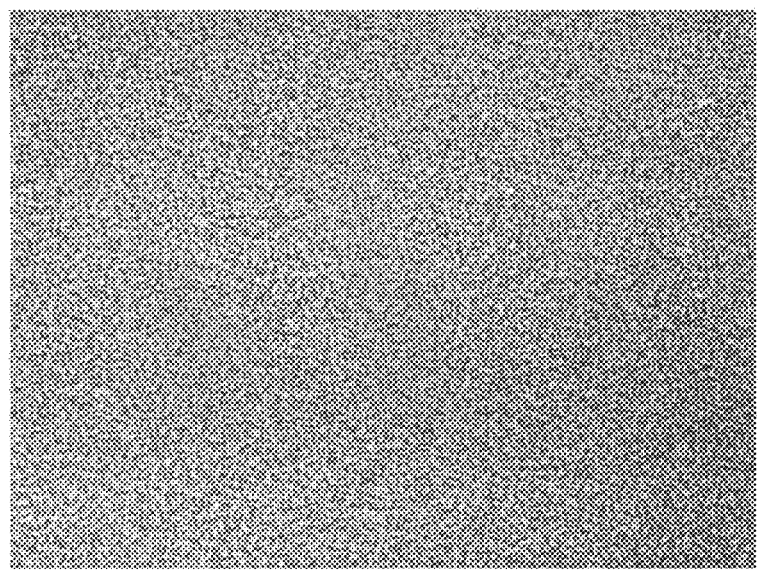

With regard to sample 1 and sample 17, in the piezoelectric body layer 70 in the status in which the second electrode 80 is not formed, the surface immediately after forming was observed using a metallurgical microscope. The results are shown in FIG. 18A and FIG. 18B. A is a photograph of sample 1 and many cracks were seen, however with regard to sample 17 of in B, the occurrence of cracks was not seen. In addition, in the same way, with regard to samples 2 to 16 and 18 to 20, the occurrence of cracks was not seen.

In this manner, in sample 1 of the (110) orientation, the occurrence of cracks was often seen, however, with regard to samples 2 to 20 strongly orienting on the surface which leans in the range of 4.75° to 28.3° from the (100) surface and leans in the range of 24.8° to 40.75° from the (110) surface, there was not the occurrence of cracks.

Thus, description has been given of one embodiment in the invention, basic configurations in the invention are not limited to the above-described embodiment. In embodiments with regard to samples 2 to 18 described above, description has been given by exemplifying the piezoelectric body layer having a BFO-based perovskite structure, by also setting the piezoelectric body layer having other perovskite structure of such sample 19 or sample 20 as the same predetermined orientation, it is possible to prevent the occurrence of cracks.

Figure 19:
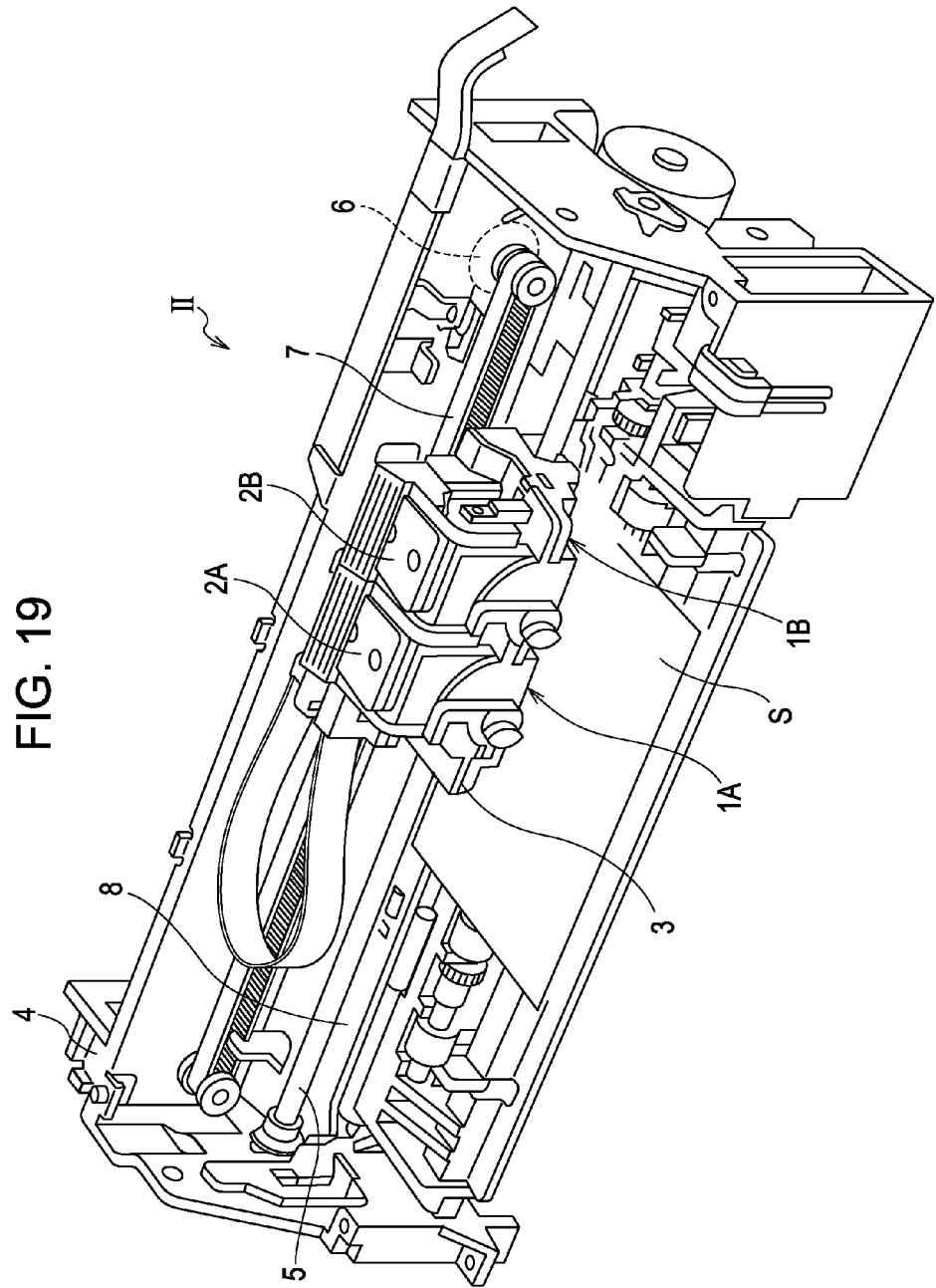
FIG. 19 is a view showing a schematic configuration of a recording apparatus according to a first embodiment of the invention.

In addition, an ink jet recording head of such an embodiment configures a part of a recording head unit possessing an ink channel which communicates with an ink cartridge or the like and is mounted on an ink jet recording apparatus. FIG. 19 is a schematic view showing an example of the ink jet recording apparatus.

In an ink jet recording apparatus II as shown in FIG. 19, cartridges 2A and 2B configuring an ink supply units are removably arranged in a recording head unit 1A and 1B having an ink jet recording head I and a carriage 3 mounting this recording head unit 1A and 1B is arranged, which can move in an axial direction, in a carriage axis 5 which is installed in an apparatus main body 4. This recording head unit 1A and 1B, for example, are set respectively as discharging a black ink composition and a color ink composition.

Then, by a driving power of a drive motor 6 being transmitted to the carriage 3 through a plurality of gears and a timing belt 7 which are not shown, the carriage 3 mounting the recording head units 1A and 1B is moved along the carriage axis 5. On the other hand, a platen 8 is arranged along the carriage axis 5 in the apparatus main body 4 and a recording sheet S which is a recording medium such as a paper fed using a feed roller or the like which is not shown, is wrapped by the platen 8 to be delivered.

Here, in the embodiment described above, description has been given by exemplifying an ink jet recording head as an example of an liquid ejecting head, however, the invention is widely targeted for overall liquid ejecting heads and can be naturally applied in the liquid ejecting heads which eject a liquid except an ink. Examples of other liquid ejecting head include, for example, various kinds of a recording head that is used in an image recording apparatus such as a printer, a coloring material ejecting head which is used in the manufacture of color filters of a liquid crystal display or the like, an electrode material ejecting head that is used in the formation of electrodes of an organic EL display, field emission display (FED) or the like, biological organic material ejecting head that is used in the manufacture of biochips or the like.

In addition, the piezoelectric element according to the invention is not limited to the piezoelectric element that is used in a liquid ejecting head and may be used in other devices. Examples of other device include, for example, an ultrasonic wave device such as an ultrasonic wave transmitter, an ultrasonic motor, a temperature-electric converter, a pressure-electric converter, a ferroelectrics transistor, a piezoelectric transformer, a filter such as a cut off filter for a harmful ray such as a infrared ray, an optical filter using a photonic crystal effect due to the formation of a quantum dot, an optical filter using an optical interference of a thin film, or the like. In addition, the invention can be applied in a piezoelectric element which is used as a sensor and a piezoelectric element which is used as a ferroelectrics memory. Examples of the sensor in which a piezoelectric element is used include, for example, an infrared ray sensor, an ultrasonic sensor, a sensible heat sensor, a pressure sensor, a pyroelectric sensor, a gyroscope (angular velocity sensor), or the like.

What is claimed is:

1. A liquid ejecting head which discharges a liquid from a nozzle opening, comprising:
    a piezoelectric element including a first electrode, a piezoelectric body layer provided on the first electrode, and a second electrode provided on the piezoelectric body layer,
    wherein the piezoelectric body layer includes a complex oxide having a perovskite structure, the piezoelectric body layer being oriented in a specific surface such that,
    when 2θ is fixed within the range of 21.9° to 22.7° to scan in the direction of the χ-axis in a measure using an X-ray diffractometer, the piezoelectric body layer has a strongest peak in the range of 4.75° to 28.3°, and
    when 2θ is fixed within the range of 31.1° to 32.6° to scan in the direction of the χ-axis in the measure using an X-ray diffractometer, the piezoelectric body layer has a strongest peak in the range of 24.8° to 40.75°.

2. A liquid ejecting apparatus comprising the liquid ejecting head according to claim 1.

3. The liquid ejecting head according to claim 1, wherein the piezoelectric body layer comprised of a buffer layer provided on the first electrode and another piezoelectric layers provided on the buffer layer.

4. The liquid ejecting head according to claim 1, wherein the complex oxide has the formula:

$(1-x)[BiFeO_3]-x[BaTiO_3]$, where ($0<x<0.40$).

5. The liquid ejecting head according to claim 1, wherein the complex oxide has the formula $ABO_3$ and the compositions of the A and B sites of the complex oxide are as follows:

$(Bi_{1-x}Ba_x)(Fe_{1-x}Ti_x)$, where ($0<x<0.40$).

6. The liquid ejecting head according to claim 1, wherein the complex oxide has the formula:

$(1-x)[Bi(Fe_{1-y}M_y)O_3]-x[BaTiO_3]$, where ($0<x<0.40$, $0.01<y<0.09$) and M is one of Mn, Cr, and Co.

7. The liquid ejecting head according to claim 1, wherein the complex oxide has the formula $ABO_3$ and the compositions of the A and B sites of the complex oxide are as follows:

$(Bi_{1-x}Ba_x)((Fe_{1-y}M_y)_{1-x}Ti_x)$, where ($0<x<0.40$, $0.01<y<0.09$), and M is one of Mn, Cr, and Co.

8. A piezoelectric element comprising:
    a first electrode;
    a piezoelectric body layer provided on the first electrode; and
    a second electrode provided on the piezoelectric body layer,
    wherein the piezoelectric body layer includes a complex oxide having a perovskite structure, the piezoelectric body layer being oriented in a specific surface such that,
    when 2θ is fixed within the range of 21.9° to 22.7° to scan in the direction of the χ-axis in a measure using an X-ray diffractometer, the piezoelectric body layer has a strongest peak in the range of 4.75° to 28.3°, and
    when 2θ is fixed within the range of 31.1° to 32.6° to scan in the direction of the χ-axis in the measure using an X-ray diffractometer, the piezoelectric body layer has a strongest peak in the range of 24.8° to 40.75°.

9. The piezoelectric element according to claim 8, wherein the complex oxide has the formula:

$(1-x)[BiFeO_3]-x[BaTiO_3]$, where ($0<x<0.40$).

10. The piezoelectric element according to claim 8, wherein the complex oxide has the formula $ABO_3$ and the compositions of the A and B sites of the complex oxide are as follows:

$(Bi_{1-x}Ba_x)(Fe_{1-x}Ti_x)$, where ($0<x<0.40$).

11. The piezoelectric element according to claim 8, wherein the complex oxide has the formula:

$(1-x)[Bi(Fe_{1-y}M_y)O_3]-x[BaTiO_3]$, where ($0<x<0.40$, $0.01<y<0.09$) and M is one of Mn, Cr, and Co.

12. The piezoelectric element according to claim 8, wherein the complex oxide has the formula $ABO_3$ and the compositions of the A and B sites of the complex oxide are as follows:

$(Bi_{1-x}Ba_x)((Fe_{1-y}M_y)_{1-x}Ti_x)$, where ($0<x<0.40$, $0.01<y<0.09$), and M is one of Mn, Cr, and Co.

13. The piezoelectric element according to claim 8, wherein the piezoelectric body layer comprised of a buffer layer provided on the first electrode and another piezoelectric layers provided on the buffer layer.

* * * * *